(12) United States Patent
Shirley

(10) Patent No.: US 6,830,619 B2
(45) Date of Patent: Dec. 14, 2004

(54) METHOD AND APPARATUS FOR CONTROLLING A TEMPERATURE OF A MICROELECTRONIC SUBSTRATE

(75) Inventor: Paul D. Shirley, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 09/924,333

(22) Filed: Aug. 7, 2001

(65) Prior Publication Data

US 2002/0002944 A1 Jan. 10, 2002

Related U.S. Application Data

(63) Continuation of application No. 09/328,042, filed on Jun. 8, 1999, now Pat. No. 6,322,626.

(51) Int. Cl.[7] .......................... B05C 11/10; B05C 11/02
(52) U.S. Cl. ..................... 118/73; 118/72; 118/608; 118/101; 118/107; 118/50; 118/52; 118/695; 156/345.11
(58) Field of Search .................. 118/666, 667, 118/52, 56, 602, 500, 501, 300, 73, 72; 427/240, 372.2, 398.1, 425, 52, 320, 758

(56) References Cited

U.S. PATENT DOCUMENTS

| | | | | |
|---|---|---|---|---|
| 3,710,251 A | * | 1/1973 | Hagge et al. ............... 324/760 |
| 4,432,635 A | * | 2/1984 | Mayer .......................... 355/30 |
| 4,544,446 A | * | 10/1985 | Cady ........................... 438/689 |
| 4,899,686 A | * | 2/1990 | Toshima et al. .............. 118/50 |
| 5,034,688 A | | 7/1991 | Moulene et al. .......... 324/158 F |
| 5,474,877 A | * | 12/1995 | Suzuki ........................ 430/325 |
| 5,567,267 A | * | 10/1996 | Kazama et al. ......... 156/345.27 |
| 5,578,127 A | * | 11/1996 | Kimura ....................... 118/695 |
| 5,578,532 A | * | 11/1996 | van de Ven et al. ......... 438/584 |
| 5,580,607 A | * | 12/1996 | Takekuma et al. ........... 427/240 |
| 5,762,709 A | | 6/1998 | Sugimoto et al. ............. 118/52 |
| 5,846,375 A | * | 12/1998 | Gilchrist et al. ........ 156/345.52 |
| 5,932,009 A | | 8/1999 | Kim et al. ..................... 118/52 |
| 6,042,712 A | | 3/2000 | Mathieu ...................... 205/209 |
| 6,073,681 A | * | 6/2000 | Getchel et al. ............. 165/80.1 |
| 6,107,608 A | | 8/2000 | Hayes ...................... 219/444.1 |
| 6,168,660 B1 | * | 1/2001 | Hayes et al. .................. 118/52 |
| 6,322,626 B1 | * | 11/2001 | Shirley ......................... 118/73 |

FOREIGN PATENT DOCUMENTS

| | | | |
|---|---|---|---|
| JP | 62-205626 A | 9/1987 |
| JP | 363140549 A | 6/1988 |
| JP | 3-230518 A | 10/1991 |
| JP | 404099018 A | 3/1992 |

* cited by examiner

*Primary Examiner*—Jeffrie R. Lund
*Assistant Examiner*—Rudy Zervigon
(74) *Attorney, Agent, or Firm*—Dorsey & Whitney LLP

(57) ABSTRACT

A method and apparatus for controlling a temperature of a microelectronic substrate. In one embodiment, the apparatus can include a substrate support configured to engage and support the microelectronic substrate. The apparatus can further include a temperature controller having one or more thermal links coupled directly with the substrate when the substrate is supported by the substrate support. The thermal links can maintain thermal contact with the substrate when the substrate is either stationary or mobile relative to the temperature controller. The temperature controller can heat or cool different portions of the substrate at different rates with one or more of several heat transfer devices, including liquid jets, gas jets, resistive electrical elements and/or thermoelectric elements.

43 Claims, 3 Drawing Sheets

METHOD AND APPARATUS FOR CONTROLLING A TEMPERATURE OF A MICROELECTRONIC SUBSTRATE

CROSS-REFERENCE TO RELATED APPLICATION

This application is a continuation of U.S. patent application Ser. No. 09/328,042, filed Jun. 8, 1999 now U.S. Pat. No. 6,322,626 filed Nov. 27, 2001.

TECHNICAL FIELD

The present invention relates to an apparatus and method for controlling the temperature of a microelectronic substrate during manufacture.

BACKGROUND OF THE INVENTION

Conventional microelectronic devices can include a substrate having a front side on which semiconductor elements and other features are formed and a back side opposite the front side. One conventional technique for forming semiconductor elements and other features on the substrate is to etch selected portions of the front side of the substrate and apply a succession of conductor, semiconductor and/or insulator layers to the substrate which together form the elements. In a typical operation, a layer of photosensitive etch-resistant material (resist) is applied to the center of the substrate and the substrate is spun to distribute the resist over the substrate by centrifugal force. Selected portions of the resist are then exposed to a selected radiation while a mask covers the unselected portions. The radiation causes the selected portions to become soluble (in the case of a positive resist process) or insoluble (in the case of a negative resist process) when exposed to a selected solvent. The solvent washes away the soluble portion of the resist, leaving the remaining portion of the resist to cover selected portions of the substrate. The exposed portions of the substrate are then etched away and the remaining resist is removed to leave one portion of the substrate recessed relative to the surrounding portions. The recessed area can be filled (or the adjacent elevated area can be built up) with the succession of conductor, semiconductor and/or insulator layers to form the semiconductor elements.

During the process discussed above, the resist is exposed to a critical dose of radiation that causes the selected or exposed portion of the resist to become either soluble or insoluble. Typically, the entire resist layer is exposed to the same critical dose of radiation. However, if the thickness of the resist layer is not uniform, the critical dose of radiation may not provide the appropriate exposure level. For example, if the resist layer is locally thick, it may be underexposed, and may not completely change its solubility. If the resist layer is locally thin, it may be overexposed and reflections from the overexposed regions may strike adjacent regions, potentially altering the geometry of the features formed on the substrate, or causing the features to overlap. Accordingly, it is important to maintain the resist layer at a uniform thickness so that a single critical dose of radiation will have the same effect on the entire resist layer.

One factor that controls the thickness of the resist layer is the temperature of the semiconductor substrate on which the resist layer is disposed. For example, where the temperature of the substrate is elevated, solvents in the resist will evaporate more rapidly, thickening the resist before it spins off the edge of the substrate, and causing a local increase in resist thickness. Conversely, where the temperature of the substrate is depressed, solvents in the resist are less likely to evaporate before the resist spins off the substrate, resulting in a local reduction in resist thickness.

To make semiconductor devices more compact, the size of the semiconductor elements on the devices are made as small as possible and are positioned as closely together as possible. Accordingly, it becomes increasingly important to control the thickness of the resist layer to ensure that the selected portions of the resist layer are exposed to the proper radiation dosage so that adjacent features are well defined and do not overlap.

One approach to controlling the distribution of the resist has been to cool the outer edge of the substrate by directing flow of rinsing solution toward the outer periphery of the back side of the substrate. The rinsing solution can cool the wafer as the rinsing solution evaporates, and can prevent the resist from flowing from the front side of the substrate around the outer edge of the substrate to the back side of the substrate. A drawback with this method is that it may not adequately control the temperature of the entire substrate, and may therefore fail to produce a uniformly thick layer of resist on the substrate. For example, even a 0.5° C. change in the substrate temperature can have a large effect on the thickness of the resist layer, and this effect may not be adequately addressed by directing rinsing solution toward the outer periphery of the substrate.

SUMMARY OF THE INVENTION

The present invention is directed toward methods and apparatuses for controlling the temperature of a microelectronic substrate. In one aspect of the invention, the apparatus can include a substrate support having at least one support surface for engaging and supporting the substrate. The apparatus can further include a temperature controller positioned at least proximate to the substrate support and having a first thermal link coupled directly with a first portion of the substrate and a second thermal link coupled directly with a second portion of the substrate. The first and second thermal links can be separately controllable for transferring heat to or from the first and second portions of the substrate at different rates.

In one aspect of the invention, the thermal link can include a plurality of nozzles proximate to the substrate, each nozzle having an orifice directed to a separate portion of the substrate. The nozzles can be arranged in an annular or concentric fashion to transfer heat to first and second annular regions of the substrate at different rates. The nozzles can direct streams of liquid or gas toward the substrate to either heat or cool selected regions of the substrate. In another aspect of this invention, the thermal links can include electrical elements positioned at least proximate to the substrate. The electrical elements can include resistive electrical heaters that heat the substrate or thermoelectric devices that can either heat or cool the substrate.

DETAILED DESCRIPTION OF THE INVENTION

The present invention is directed toward methods and apparatuses for controlling the temperature of a microelectronic substrate during manufacture. The apparatus can include a temperature controller that can vary the heat transferred to or from different portions of the substrate to keep the substrate temperature uniform, or to impose a temperature distribution on the substrate. Many specific details of certain embodiments of the invention are set forth in the following description and in FIGS. 1–4 to provide a thorough understanding of such embodiments. One skilled in the art, however, will understand that the present invention may have additional embodiments and that they may be practiced without several of the details described in the following description.

Figure 1:
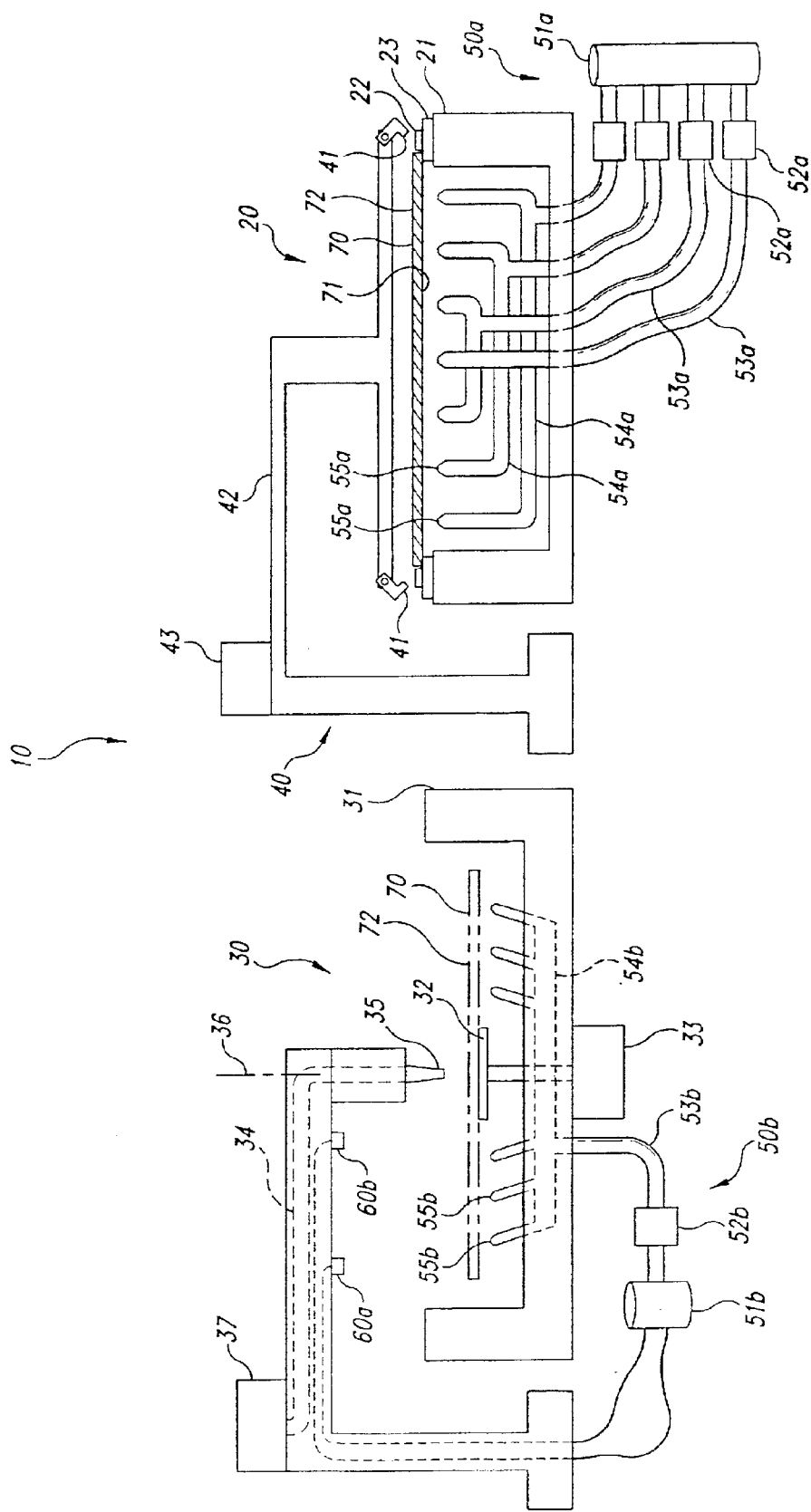
FIG. 1 is a partially schematic, partial cross-sectional side elevation view of an apparatus having a chill plate assembly and a coater bowl assembly in accordance with an embodiment of the invention.

FIG. 1 is a partially schematic, partial cross-sectional side elevation view of an apparatus 10 in accordance with an embodiment of the invention. The apparatus 10 can include a chill plate assembly 20 positioned proximate to a coater bowl assembly 30. A transfer device 40, such as a robotic arm, is positioned to transfer a microelectronic substrate 70 between the chill plate assembly 20 and the coater bowl assembly 30. Two temperature controllers 50 (shown as a plate temperature controller 50a and a bowl temperature controller 50b) can control the temperature of the substrate 70 when the substrate 70 is positioned on the chill plate assembly 20 and the coater bowl assembly 30, respectively.

In one embodiment, the chill plate assembly 20 can be configured to transfer heat to and/or from the substrate 70. For example, the chill plate assembly 20 can cool the substrate 70 after the substrate 70 receives a coating of primer in a high temperature process. Alternatively, the chill plate assembly 20 can be used to heat the substrate 70, or to heat one portion of the substrate 70 while cooling another portion. Accordingly, the plate temperature controller 50a can include a fluid supply 51a coupled with conduits 53a to manifolds 54a positioned proximate to the substrate 70. The manifolds 54a can include nozzles having orifices 55a facing the substrate 70. The fluid supply 51a can direct temperature-controlled fluid to the manifolds 54a and through the orifices 55a to form fluid streams or jets. The fluid streams or jets can impinge on a back side 71 of the substrate 70 to provide a plurality of thermal links between the plate temperature controller 50a and the substrate 70.

In one embodiment, the fluid supply 51a can include a source of liquid, such as water or other liquids that are compatible with the substrate 70. In another embodiment, the fluid supply 51a can include a source of gas, such as air, nitrogen, or other gases that are compatible with the substrate 70. In either case, the fluid supply 51a can be coupled to a plurality of heat exchangers 52a that are individually controllable to direct fluid at different temperatures to each manifold 54a. Accordingly, the plate temperature controller 50a can transfer heat to or from different portions of the substrate 70 at different rates.

In one aspect of this embodiment, the different heat transfer rates can generate a uniform temperature distribution over a front side 72 of the substrate 70 that initially had a non-uniform temperature distribution. For example, if the substrate 70 arrives at the chill plate assembly 20 with the periphery of the front side 72 cooler than the center of the front side 72, the plate temperature controller 50a can be operated to cool the center of the substrate 70 more rapidly than the periphery. Alternatively, the plate temperature controller 50a can generate a non-uniform temperature distribution on the front side 72 of the substrate 70 to compensate in advance for a subsequent non-uniform heat transfer process, as will be discussed in greater detail below.

In one embodiment, the substrate 70 can be positioned a selected distance above the orifices 55a. Accordingly, the chill plate assembly 20 can include a substrate support 21 having a plurality of stand-offs 23 that provide the desired separation between the substrate 70 and the orifices 55a. The stand-offs 23 can be spaced apart and arranged such that a substantial portion of the back side 71 of the substrate 70 is in contact with the thermal links provided by the temperature controller 50a. In a further aspect of this embodiment, each stand-off 23 can also include a centering guide 22 adjacent the outer edge of the substrate 70 for centering the substrate, as will be described in greater detail below with reference to FIG. 4.

In one embodiment, the manifolds 54a and orifices 55a can be arranged in an annular and/or concentric fashion with respect to each other, as shown in FIG. 1. Accordingly, the plate temperature controller 50a can be used to separately control the heat transferred to or from different annular regions of the substrate 70. In other embodiments, the manifold 54a and the orifices 55a can have other arrangements to control the heat transferred to or from regions of the substrate 70 having non-annular shapes. In still further embodiments, the orifices 55a can be positioned proximate to the front side 72 (rather than the back side 71) of the substrate 70 to transfer heat directly to or from the front side 72. An advantage of transferring heat to or from the back side 71 of the substrate 70 is that such a method may be less likely to damage components or features on the front side 72.

In one method of operation, the transfer device 40 moves the substrate 70 from a vapor deposition chamber (not shown) to the chill plate assembly 20 for cooling. The plate temperature controller 50a is then activated to cool the substrate 70. Once the substrate 70 has cooled, the transfer device 40 can retrieve the substrate 70 and move it to the coater bowl assembly 30, where the substrate 70 is shown in phantom lines. In one embodiment, the transfer device 40 can include an arm 42 having a plurality of fingers 41 that engage the back side 71 of the substrate 70 to lift the substrate 70 from the chill plate assembly 20. An actuator 43 coupled to the arm 42 and the fingers 41 can raise, lower and rotate the arm 42 with the substrate 70 attached and move the arm 42 and the substrate 70 to the coater bowl assembly 30.

The coater bowl assembly 30 can apply a liquid coating to the substrate 70 while rotating and controlling the temperature of the substrate 70. In one embodiment, the coater bowl assembly 30 includes a liquid source 37 coupled to a conduit 34. The conduit 34 terminates in a nozzle 35 that directs liquid from the liquid source 37 to the upward-facing front side 72 of the substrate 70. The substrate 70 is supported by a rotatable chuck 32, such as a vacuum chuck. The chuck 32 is coupled to a drive unit 33 for rotating the substrate 70 about a rotation axis 36. As the substrate 70 rotates, the liquid disposed on the front side 72 of the substrate 70 spreads over the front side 72 by centrifugal force. A coater bowl 31 is disposed annularly around the substrate 70 to collect liquid that runs off the edges of the substrate 70 as the substrate 70 rotates.

The bowl temperature controller 50b is coupled to the coater bowl assembly 30 to transfer heat to or away from the substrate 70 as the substrate 70 rotates relative to the coater bowl 31. In one embodiment, the temperature controller 50b includes a fluid supply 51b coupled to a single heat exchanger 52b which is in turn coupled with a conduit 53b to a single manifold 54b. The manifold 54b includes a plurality of orifices 55b disposed in a concentric, annular arrangement about the rotatable chuck 32 to transfer heat to or from the substrate 70.

The heat transferred to or from the substrate 70 can be controlled by adjusting the flow rate through each of the orifices 55b. For example, the orifices 55b toward the periphery of the substrate 70 can be smaller than those toward the center of the substrate 70 to reduce the rate of heat transfer to or from the periphery of the substrate 70. Alternatively, each of the orifices 55a can have a variable diameter that can be adjusted manually or via an actuator to direct the flow at a selected flow rate through each orifice 55a. In another embodiment, the bowl temperature controller 50b can include a plurality of heat exchangers 52b and manifolds 54b, arranged in a manner generally similar to that discussed above with reference to the plate temperature controller 50a.

In one embodiment, the coater bowl assembly 30 can also include one or more temperature sensors positioned proximate to the front side 72 of the substrate 70 to detect one or more temperatures of the substrate 70. For example, as shown in FIG. 1, the coater bowl assembly 30 can include a peripheral temperature sensor 60a aligned with the peripheral region of the substrate 70 and a central temperature sensor 60b aligned with the central region of the substrate. In one embodiment, the temperature sensors 60a, 60b can include infrared sensors and in other embodiments, the temperature sensors can include other suitable devices. The temperature sensors 60a, 60b can be coupled to the bowl temperature controller 50b to provide a temperature feedback loop. Accordingly, the bowl temperature controller 50b can receive signals from the temperature sensors 60a, 60b and adjust the heat transfer rate to and/or from the substrate 70 to achieve a desired temperature distribution on the front side 72 of the substrate 70.

In one embodiment, for example, where the fluid dispensed through the nozzle 35 is a resist material, it may be desirable to maintain the front side 72 of the substrate 70 at a uniform temperature, to prevent solvents in the resist material from evaporating more quickly in one region of the substrate 70 than another. For example, as the substrate 70 rotates about the rotation axis 36, the periphery of the substrate 70 will have a higher linear velocity than the center of the substrate 70, and may accordingly cool more quickly. Accordingly, in one aspect of the operation of the apparatus 10, the bowl temperature controller 50b can compensate for this effect by either heating the peripheral region of the substrate 70 or cooling the center region of the substrate 70. As a result, the front side 72 of the substrate 70 can be maintained at an approximately uniform temperature, reducing the likelihood that the resist solvent will evaporate unevenly, and therefore reducing the likelihood that the resist will locally thicken.

In an alternate method of operation, the periphery of the substrate 70 can be pre-heated (or the center region of the substrate 70 can be pre-cooled) at the chill plate assembly 20 before the substrate 70 is moved to the coater bowl assembly 30. The temperature distribution will then tend to become uniform as the substrate 70 rotates on the coater bowl assembly 30 and the periphery of the substrate 70 cools relative to the center of the substrate 70. The pre-heating and/or pre-cooling operation can be conducted in addition to or in lieu of controlling the temperature at the coater bowl assembly 30.

As was discussed above, the coater bowl assembly 30 can dispense a resist material on the surface of the substrate 70 in accordance with one embodiment of the invention. Alternatively, the coater bowl assembly 30 (or a similar, separate assembly) can be used to dispense other fluids, such as an antireflective coating or a developing solution. Where the coater bowl assembly 30 dispenses a resist material, the bowl temperature controller 50b can supply a resist solvent through the orifices 55b to prevent the resist from flowing around the periphery of the substrate 70 and collecting on the back side 71 of the substrate 70.

Figure 2:
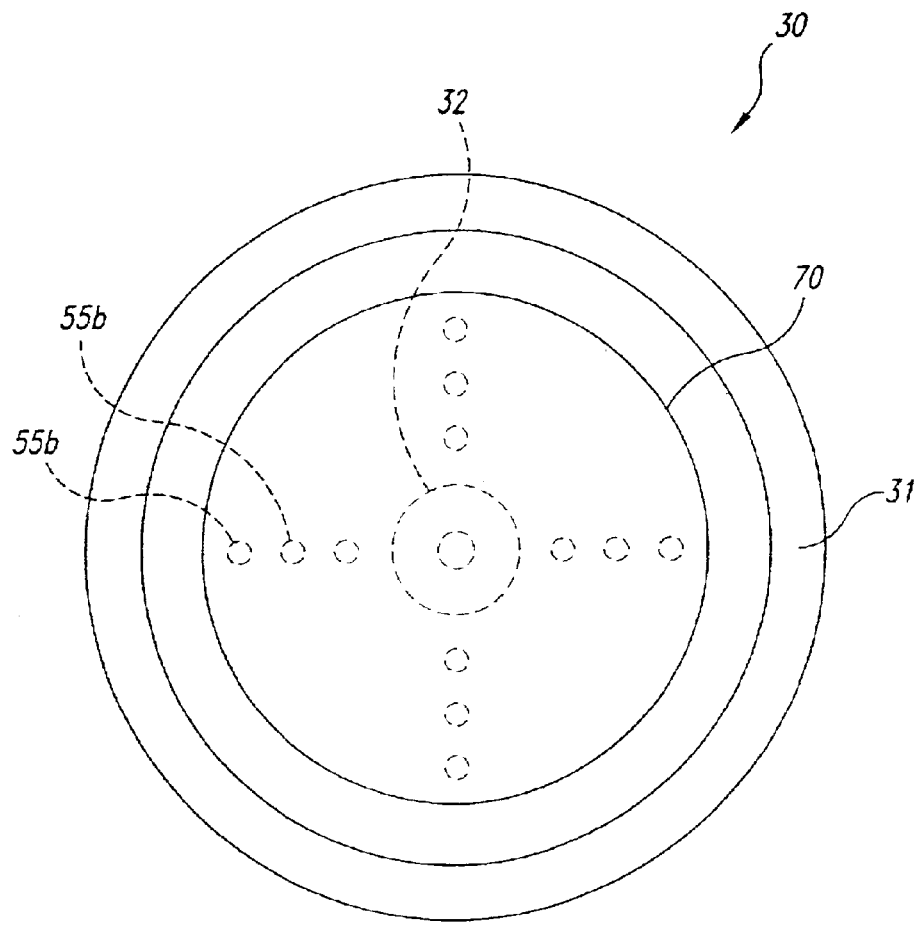
FIG. 2 is a top plan view of a portion of the coater bowl assembly shown in FIG. 1.

FIG. 2 is a top plan view of a portion of the coater bowl assembly 30 shown in FIG. 1. As shown in FIG. 2, the orifices 55b of the coater bowl assembly 30 can be arranged in three annular rings to transfer heat to or from three annular regions of the substrate 70. In one aspect of this embodiment, the orifices 55b are arranged in a cross-arm pattern to transfer heat at four evenly spaced locations within each annular region. In other embodiments, the coater bowl assembly 30 can include more or fewer orifices 55b within each annular region and/or more or fewer annular regions. The orifices 55a (FIG. 1) can be arranged similarly.

Figure 3:
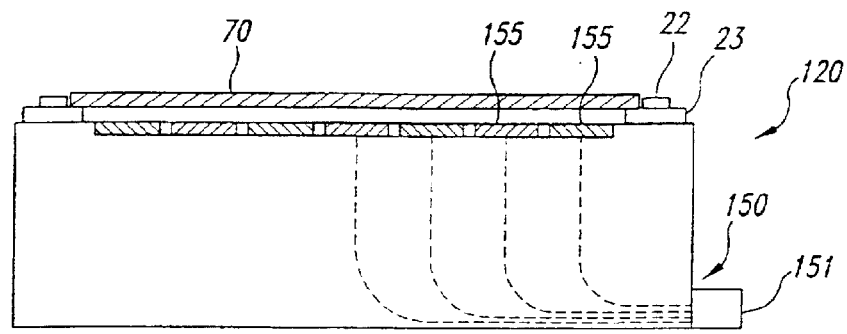
FIG. 3 is a partially schematic, partial cross-sectional side elevation view of a chill plate assembly in accordance with another embodiment of the invention.

FIG. 3 is a partially schematic, partial cross-sectional side elevation view of a portion of a chill plate assembly 120 in accordance with another embodiment of the invention. The chill plate assembly 120 can include a temperature controller 150 having a power supply 151 coupled to a plurality of electrical elements 155. In one embodiment, the electrical elements 155 can include resistive electrical heaters spaced apart from the substrate 70 to heat the substrate 70 directly by conduction, convection and/or radiation. Alternatively, the electrical elements 155 can include thermoelectric devices or some other device configured to heat or cool the substrate 70, depending upon the direction in which current is applied to the devices. Such thermoelectric devices are available from Melcor, Co., of Trenton, N.J. In one aspect of this embodiment, the substrate 70 can be spaced apart from the electrical elements 155 by a distance of approximately 0.13 mm and in other embodiments, the stand-off distance can be greater or lesser depending on the heat transfer characteristics of the substrate 70 and the electrical elements 155. For example, in one alternate embodiment, the stand-offs 23 can be eliminated and the substrate 70 can rest directly on the electrical elements 155. In some applications, it may be desirable to use the stand-offs 23 to avoid contaminating the back side 71 of the substrate 70.

Figure 4:
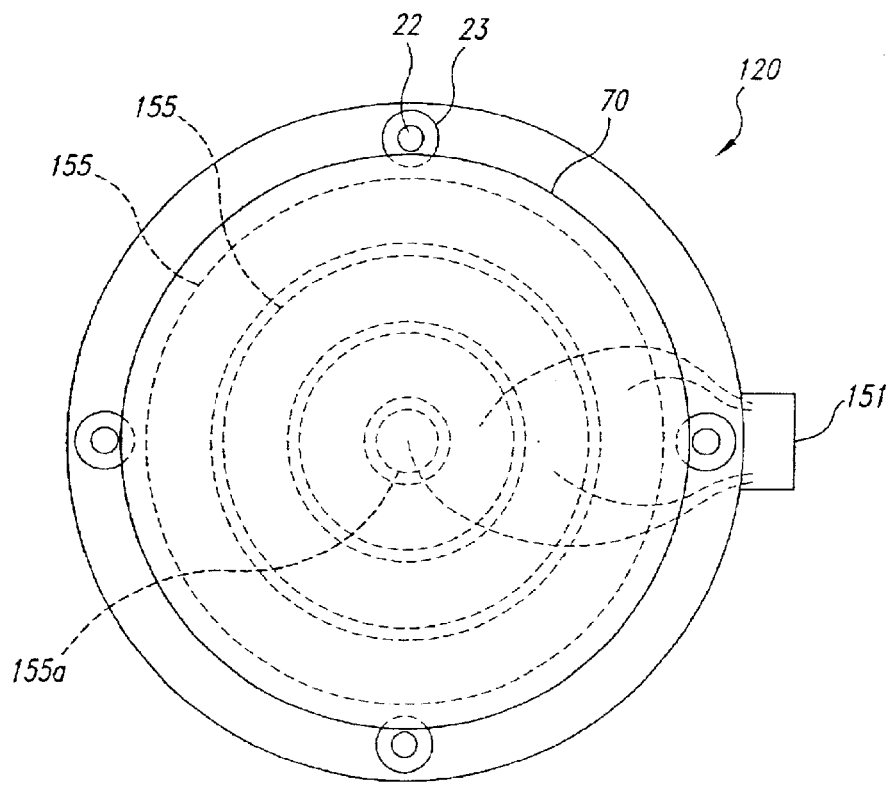
FIG. 4 is a top plan view of a portion of the chill plate assembly shown in FIG. 3.

FIG. 4 is a top plan view of the chill plate assembly 120 shown in FIG. 3. As shown in FIG. 4, the electrical elements 155 can be arranged annularly and concentrically in a manner similar to that discussed above with reference to the orifices 55a, 55b shown in FIG. 1. As is also shown in FIG. 4, the four centering guides 22 can be positioned around the periphery of the substrate 70 to center the substrate 70 over the innermost electrical element 155a. Accordingly, the centering guides 22 can be spaced apart from each other by a distance that is slightly greater than the diameter of the substrate 70.

An advantage of the electrical elements 155 discussed above with reference to FIGS. 3 and 4 is that they may more uniformly transfer heat to or from the substrate 70 than does a liquid or gas jet. Conversely, an advantage of the liquid and/or gas jets discussed above with reference to FIGS. 1 and 2 is that they may more quickly transfer heat to and/or from the substrate 70.

An advantage of the apparatus and methods discussed above with reference to FIGS. 1–4 is that they can more accurately control, adjust, and/or maintain the temperature of the substrate 70 before and/or during application of a fluid to the substrate 70. Accordingly, a fluid can be more uniformly distributed over the front side 72 of the substrate 70. As a result, subsequent processing operations can be more accurately controlled. For example, where the fluid dispensed on the front side 72 of the substrate 70 is a resist material, the more uniformly distributed resist material can be more uniformly exposed to a selected radiation, producing a more uniform etch pattern and therefore more accurately defined semiconductor devices.

From the foregoing it will be appreciated that, although specific embodiments of the invention have been described herein for purposes of illustration, various modifications may be made without deviating from the spirit and scope of the invention. For example, the chill plate assembly can be operated in conjunction with or independently from the coater bowl assembly. Accordingly, the invention is not limited except as by the appended claims.

What is claimed is:

1. An apparatus for controlling a temperature of a microelectronic substrate, the substrate having a first surface and a second surface opposite the first surface, the apparatus comprising: a substrate support having at least one support surface for engaging and supporting the substrate, the support surface being rotatable about an axis extending through the substrate and perpendicular to the first surface and the second surface; and a temperature controller positioned at least proximate to the substrate support, the temperature controller having a first thermal link coupled with a first portion of the substrate and a second thermal link coupled with a second portion of the substrate, the first and second thermal links being separately controllable for transferring heat to or from the first and second portions of at least one of the first and second surfaces at different rates, wherein the first thermal link comprises a first nozzle configured to direct a first fluid stream toward the first portion of the substrate, and the second thermal link comprises a second nozzle configured to direct a second fluid stream toward the second portion of the substrate.

2. The apparatus of claim 1 wherein the temperature controller is fixed relative to the substrate when the substrate is supported by the substrate support.

3. The apparatus of claim 1, further comprising a liquid supply conduit having an opening for dispensing a liquid onto the substrate.

4. The apparatus of claim 3 wherein the supply conduit is positioned adjacent the first surface of the substrate when the substrate is supported by the substrate support for disposing the fluid on the first surface, further wherein the first and second thermal links are positioned adjacent the second surface for transferring heat to or from the second surface.

5. The apparatus of claim 1, further comprising a source of compressed gas coupled to the first and second nozzles.

6. The apparatus of claim 5, wherein the source of compressed gas includes a source of compressed air.

7. The apparatus of claim 1, further comprising a manifold coupled to the first and second nozzles.

8. The apparatus of claim 1, further comprising a source of liquid coupled to the first and second nozzles.

9. The apparatus of claim 1 wherein the first thermal link is coupled directly with the first portion of the substrate and the second thermal link is coupled directly with the second portion of the substrate.

10. The apparatus of claim 1 wherein the first thermal link includes a first electrical element spaced apart from the first portion of the substrate and the second thermal link includes a second electrical element spaced apart from the second portion of the substrate.

11. The apparatus of claim 10 wherein the substrate support includes at least one standoff having an engaging surface for engaging the substrate, the engaging surface being spaced apart from the first and second electrical elements.

12. The apparatus of claim 10 wherein the first electrical element includes a first thermoelectric device and the second electrical element includes a second thermoelectric device, the thermoelectric devices configured to generate a heating effect when current is passed through the devices in a first direction and a cooling effect when current is passed through the devices in an opposite direction.

13. The apparatus of claim 1 wherein the substrate support is rotatable about a rotation axis and the first thermal link is spaced apart from the rotation axis by a first distance and the second thermal link is spaced apart from the rotation axis by a second distance different than the first distance.

14. The apparatus of claim 1 wherein the substrate support is rotatable about a rotation axis that extends through the first thermal link.

15. The apparatus of claim 1 wherein the first and second thermal links are annular relative to an axis extending generally perpendicular to at least one of the first and second surfaces of the substrate.

16. The apparatus of claim 1 wherein the first and second thermal links are concentric relative to an axis extending generally perpendicular to at least one of the first and second surfaces of the substrate.

17. The apparatus of claim 1 wherein the first thermal link includes a heat source.

18. The apparatus of claim 1 wherein the first thermal link includes a cooling source.

19. The apparatus of claim 1 wherein the substrate support includes rotatable chuck for releasably engaging the substrate.

20. The apparatus of claim 1 wherein the substrate support includes an upwardly facing bowl for retaining excess fluid that drips from the substrate.

21. The apparatus of claim 1 wherein the temperature controller includes a temperature sensor for monitoring at least one temperature of the substrate, further wherein the temperature sensor is coupled to the first and second thermal links to maintain the first and second portions of the substrate at approximately the same temperature.

22. An apparatus for controlling a temperature of a microelectronic substrate, the substrate having a first surface and a second surface opposite the first surface, the apparatus comprising: a substrate support having an engaging surface positioned to support a peripheral portion of the second surface of the substrate, the substrate support having an open portion projecting through the substrate support and adjacent the second surface of the substrate to allow direct thermal contact with the second surface, the support being rotatable about an axis extending through the substrate and perpendicular to the first surface and the second surface; and a temperature controller coupled to a source of gas, the temperature controller having at least two orifices proximate to the substrate support for directing a flow of the gas through the at least two orifices that directly impinge against the second surface of the substrate.

23. The apparatus of claim 22 wherein the engaging surface of the substrate support is rotatable relative to the orifice of the temperature controller to rotate the substrate relative to the orifice.

24. The apparatus of claim 22 wherein the orifice is a first orifice aligned with a first portion of the substrate, the source of gas having a second orifice aligned with a second portion of the substrate, the temperature controller being controllable to transfer heat at a first rate to or from the substrate through the first orifice, the temperature controller being controllable to transfer heat at a second rate to or from the substrate through the second orifice.

25. The apparatus of claim 22 wherein the source of compressed gas includes a source of compressed air.

26. The apparatus of claim 22 wherein the source of gas has a temperature less than a temperature of the substrate to cool the substrate.

27. The apparatus of claim 22 wherein the source of gas has a temperature greater than a temperature of the substrate to heat the substrate.

28. The apparatus of claim 22, further comprising: a liquid supply conduit having an opening positioned proximate to the substrate support for disposing a liquid on the substrate; and a source of the liquid coupled to the liquid supply conduit.

29. The apparatus of claim 22 wherein the substrate support is rotatable about a rotation axis that is approximately perpendicular to the first and second surfaces and the first thermal link is spaced apart from the rotation axis by a first distance and the second thermal link is spaced apart from the rotation axis by a second distance different than the first distance.

30. The apparatus of claim 22 wherein the substrate support includes a rotatable chuck for releasably engaging the substrate.

31. The apparatus of claim 22 wherein the substrate support includes an bowl for retaining excess fluid that drips from the substrate, the bowl facing upwardly towards the second surface.

32. An apparatus for controlling a temperature of a microelectronic substrate, the substrate having a first surface and a second surface opposite the first surface, the apparatus comprising: a substrate support having at least one support surface for engaging and supporting the substrate, the at least one support surface being rotatable about an axis extending through the substrate and perpendicular to the first surface and the second surface; and a temperature controller positioned at least proximate to the substrate support and being generally fixed relative to the substrate when the substrate is supported by the substrate support, the temperature controller having a first thermal link coupled directly with a first portion of the substrate and a second thermal link coupled directly with a second portion of the substrate, the first and second thermal links being separately controllable for directing a first fluid stream and a second fluid stream to the respective first and second portions of the substrate to transfer heat to or from the first and second portions of the substrate at different rates.

33. The apparatus of claim 32 wherein the first thermal link includes a first nozzle having a first orifice directed toward the first portion of the substrate and the second thermal link includes a second nozzle having a second orifice directed toward the second portion of the substrate.

34. The apparatus of claim 33, further comprising a source of compressed gas coupled to the first and second nozzles.

35. The apparatus of claim 33, further comprising a source of liquid coupled to the first and second nozzles.

36. The apparatus of claim 32 wherein the first thermal link includes a first electrical element spaced apart from the first portion of the substrate and the second thermal link includes a second electrical element spaced apart from the second portion of the substrate.

37. The apparatus of claim 36 wherein the first electrical element includes a first thermoelectric device spaced apart from the first portion of the substrate and the second electrical element includes a second thermoelectric device spaced apart from the second portion of the substrate.

38. The apparatus of claim 33 wherein the first thermal link includes a heat source.

39. The apparatus of claim 33 wherein the first thermal link includes a cooling source.

40. An apparatus for controlling a temperature of a microelectronic substrate having a first surface and a second surface opposite the first surface, the apparatus comprising: a first substrate support configured to engage the substrate, the substrate support being rotatable about an axis extending through the substrate and perpendicular to the first surface and the second surface; a first temperature controller proximate to the first substrate support to transfer heat to or from the substrate while the substrate is engaged by the first substrate support in a generally stationary position relative to the first temperature controller, the first temperature controller having a first thermal link coupled directly with a first portion of the substrate and a second thermal link coupled directly with a second portion of the substrate, the first and second thermal links being separately controllable for transferring heat to or from the first and second portions at different rates by impinging a first fluid stream and a second fluid stream against respective first and second portions of the substrate; a second support proximate to the first support and configured to engage the substrate while a liquid material is applied to the substrate, the second support having a rotatable portion for rotating the substrate; a second temperature controller proximate to the second substrate support to transfer heat to or from the substrate while the liquid material is applied to the substrate and while the substrate rotates, the second temperature controller having a third thermal link directly coupled with the first portion of the substrate and a fourth thermal link directly coupled with the second portion of the substrate, the third and fourth thermal links being separately controllable for transferring heat to or from the first and second portions at different rates by impinging a third fluid stream and a fourth fluid stream against respective third and fourth portions of the substrate; and a liquid supply conduit having an opening for dispensing the liquid material onto the substrate when the substrate is supported by the second support.

41. The apparatus of claim 40 wherein at least one of the temperature controllers includes a first nozzle having a first orifice directed to the first portion of the substrate and a second nozzle having a second orifice directed to the second portion of the substrate, the first and second nozzles being coupled to a source of gas for controlling the temperature of the substrate.

42. The apparatus of claim 40 wherein at least one of the temperature controllers includes a first electrical element spaced apart from the first portion of the substrate and a second electrical element spaced apart from the second portion of the substrate.

43. The apparatus of claim 42 wherein the first electrical element includes a first thermoelectric device and the second electrical element includes a second thermoelectric device.

* * * * *

UNITED STATES PATENT AND TRADEMARK OFFICE
CERTIFICATE OF CORRECTION

PATENT NO. : 6,830,619 B2 Page 1 of 1
APPLICATION NO. : 09/924333
DATED : December 14, 2004
INVENTOR(S) : Paul D. Shirley It is certified that error appears in the above-identified patent and that said Letters Patent is hereby corrected as shown below:

| Column, Line | Reads | Should Read |
|---|---|---|
| Column 1, Line 9 | "filed Nov. 27, 2001." | --issued Nov. 27, 2001.-- |
| Column 2, Line 13 | "by directing" | --by directing the-- |
| Column 7, Line 50 | "the fluid on the" | --the liquid on the-- |
| Column 8, Line 35 | "includes rotatable chuck" | --includes a rotatable chuck-- |
| Column 9, Line 31 | "includes an bowl" | --includes a bowl-- |

Signed and Sealed this

Twelfth Day of December, 2006

JON W. DUDAS
*Director of the United States Patent and Trademark Office*